United States Patent
Wu et al.

(10) Patent No.: US 10,931,079 B2
(45) Date of Patent: Feb. 23, 2021

(54) BRILLOUIN SENSING SYSTEM USING OPTICAL MICROWAVE FREQUENCY DISCRIMINATORS AND SCRAMBLER

(71) Applicants: Zibo Qi-Red PhotoElectric Technology Co., Ltd., Shandong (CN); Beijing Qi-Red PhotoElectric Technology Co., Ltd., Beijing (CN)

(72) Inventors: Shudong Wu, Beijing (CN); Wenbo Wang, Beijing (CN)

(73) Assignees: Zibo Qi-Red PhotoElectric Technology Co., Ltd., Zibo (CN); Beijing Qi-Red PhotoElectric Technology Co., Ltd., Beijing (CN)

( * ) Notice: Subject to any disclaimer, the term of this patent is extended or adjusted under 35 U.S.C. 154(b) by 459 days.

(21) Appl. No.: 15/989,185

(22) Filed: May 25, 2018

(65) Prior Publication Data
US 2018/0278009 A1    Sep. 27, 2018

(30) Foreign Application Priority Data

Dec. 6, 2017    (CN) .......................... 2017 1 1274067

(51) Int. Cl.
*H01S 3/13* (2006.01)
*H01S 3/067* (2006.01)
(Continued)

(52) U.S. Cl.
CPC ....... *H01S 3/1305* (2013.01); *G01D 5/35316* (2013.01); *G01D 5/35348* (2013.01);
(Continued)

(58) Field of Classification Search
CPC ......... G01K 2011/322; G01D 5/35316; G01D 5/35335; H01S 3/302
See application file for complete search history.

(56) References Cited

U.S. PATENT DOCUMENTS

2007/0223003 A1* 9/2007 Koste .................... G01B 11/18
356/478
2014/0268110 A1* 9/2014 Hartog ............... G01D 5/35364
356/73.1

(Continued)

OTHER PUBLICATIONS

Feng, C. et al., "The state-of-the-art of Brillouin distributed fiber sensing.Fiber Optic Sensing-Principle, Measurement and Applications," IntechOpen, retrieved from ntechopen.com/books/fiber-optic-sensing-principle-measurement-and-applications/the-state-of-the-art-of-brillouin-distributed-fiber-sensing (2019).*

*Primary Examiner* — Eric L Bolda

(57) ABSTRACT

In a Brillouin sensing system using optical microwave frequency discriminators and a scrambler provided by the present invention, a laser signal outputted by a distributed feedback laser is divided into two paths of optical signals through a coupler, one path of optical signal is modulated by a modulator to act as a pump light signal and then is transmitted to sensing fibers through a circulator; another path of optical signal is modulated by another modulator to act as a detecting light signal and then directly enters the sensing fibers. When the frequency difference between the pump light and the detecting light is equal to the Brillouin frequency shift of a certain region in the fibers, the region produces the stimulated Brillouin scattering effect, so that through determining the frequency shift and power of the Brillouin scattering signal, the temperature and stress of the sensing fibers are obtained.

2 Claims, 2 Drawing Sheets

(51) Int. Cl.
*G02B 27/10* (2006.01)
*H01S 3/10* (2006.01)
*H01S 3/136* (2006.01)
*H01S 3/0941* (2006.01)
*H01S 3/30* (2006.01)
*G01D 5/353* (2006.01)
*H01S 5/12* (2006.01)
*H01S 5/00* (2006.01)
*H01S 3/00* (2006.01)

(52) U.S. Cl.
CPC ....... *G02B 27/106* (2013.01); *G02B 27/1006* (2013.01); *G02B 27/108* (2013.01); *H01S 3/0014* (2013.01); *H01S 3/0675* (2013.01); *H01S 3/06754* (2013.01); *H01S 3/0941* (2013.01); *H01S 3/10061* (2013.01); *H01S 3/136* (2013.01); *H01S 3/302* (2013.01); *H01S 5/0085* (2013.01); *H01S 5/12* (2013.01); *G01D 5/35364* (2013.01); *H01S 2301/02* (2013.01)

(56) References Cited

U.S. PATENT DOCUMENTS

| | | | |
|---|---|---|---|
| 2017/0108358 A1* | 4/2017 | Bastianini | G01D 5/35364 |
| 2019/0195665 A1* | 6/2019 | Soga | G01L 1/242 |
| 2020/0109971 A1* | 4/2020 | Lanticq | G01K 11/32 |
| 2020/0166384 A1* | 5/2020 | Zhou | G01K 17/10 |

* cited by examiner

US 10,931,079 B2

BRILLOUIN SENSING SYSTEM USING OPTICAL MICROWAVE FREQUENCY DISCRIMINATORS AND SCRAMBLER

CROSS REFERENCE OF RELATED APPLICATION

The present invention claims priority under 35 U.S.C. 119(a-d) to CN 201711274067.4, filed Dec. 6, 2017.

BACKGROUND OF THE PRESENT INVENTION

Field of Invention

The present invention relates to a technical field of optical fiber sensing technology, and more particularly to a Brillouin sensing system using optical microwave frequency discriminators and a scrambler.

Description of Related Arts

The optical fiber sensor technology is a rapidly developing new technology. Since 1977, with the large-scale popularization and application of optical fiber technology, the research on the optical fiber sensor technology has been developed rapidly in the world. At present, the theory of the optical fiber sensing technology in the world and related optical devices have matured and their application fields are also constantly expanding. The current optical fiber sensing technology has been widely applied to national defense, machinery, energy, transportation, metallurgy, petroleum, chemical industry, medical treatment, aviation, aerospace, weather and many other fields.

The Brillouin scattering effect in optical fibers is able to monitor the ambient temperature and the strain at the same time, in which the monitoring distance is long and the detection accuracy is high. Therefore, it has gained wide attention in the distributed optical fiber sensing technology. Its basic principle is that the pump light and the probe light are respectively introduced into two ends of the sensing fiber, and when the frequency difference between the pump light and the probe light is equal to the Brillouin frequency shift of a certain region in the sensing fiber, the stimulated Brillouin scattering effect will be produced in this region, so that the sensing fiber temperature/strain detection is able to be achieved through analyzing the relationship between the Brillouin frequency shift and both the temperature and the strain.

At present, there are already patents of dynamic distributed Brillouin optical fiber sensors which utilize the optical frequency-agility technology both at home and abroad, such as Chinese Patent Publication No. CN103335666A filed on Jun. 13, 2013 and entitled "Dynamic Distributed Brillouin Optical Fiber Sensing Device and Method".

SUMMARY OF THE PRESENT INVENTION

According to the Brillouin scattering principle, the measure temperature and stress accuracy of the sensing fibers depend entirely on the control accuracy of the Brillouin frequency shift. The present invention adopts the optical microwave frequency discriminators to improve the control accuracy of the Brillouin frequency shift, and simultaneously, adopts the multi-spectral channel ($f_{-2}$, $f_{-1}$, $f_0$, $f_{+1}$ and $f_{+2}$) technology to basically maintain the optical signal energy constant over a long distance, so that the monitoring accuracy is not affected by the length of the distance. Furthermore, the scrambler adopted by the present invention also greatly improves the signal to noise ratio of the system.

A Brillouin sensing system using optical microwave frequency discriminators and a scrambler, comprises: a DFB (Distributed Feedback) laser, a polarization controller, an optical fiber amplifier, a scrambler, sensing fibers, a photodetector, a data processing module, a first coupler, a second coupler, a third coupler, a fourth coupler, a first modulator, a second modulator, a third modulator, a fourth modulator, a first optical microwave frequency discriminator, a second optical microwave frequency discriminator, a first circulator, a second circulator, a third circulator, a fourth circulator, a fifth circulator, a first fiber Bragg grating, a second fiber Bragg grating, a third fiber Bragg grating, a fourth fiber Bragg grating, a first pulse generator, and a second pulse generator.

A light beam outputted by the DFB laser is divided into two paths of same laser signals through the first coupler; a path of laser signal is inputted into the first modulator, and then the first modulator outputs a first optical signal to the second coupler, the second coupler outputs 2% of the first optical signal to the fourth coupler; another path of laser signal is inputted into the second modulator, the second modulator outputs a second optical signal to the third coupler, the third coupler outputs 2% of the second optical signal to the fourth coupler; the fourth coupler receives and mixes 2% of the first optical signal outputted by the second coupler, with 2% of the second optical signal outputted by the third coupler; an output end of the fourth coupler is connected with an end a of the first circulator, an end b of the first circulator is connected with the first fiber Bragg grating, the first fiber Bragg grating reflects a third optical signal to the first optical microwave frequency discriminator through an end c of the first circulator, the first optical microwave frequency discriminator provides a first modulated signal for the first modulator; the first fiber Bragg grating transmits a fourth optical signal to the second optical microwave frequency discriminator, the second optical microwave frequency discriminator provides a second modulated signal for the second modulator;

the third coupler receives the second optical signal outputted by the second modulator and then outputs 98% of the second optical signal as a detecting light to the sensing fibers;

the second coupler receives the first optical signal outputted by the first modulator and then outputs 98% of the first optical signal to an end a of the second circulator; an end b of the second circulator is connected with the fourth modulator through the second fiber Bragg grating; the second Bragg grating reflects a fifth optical signal back to the second circulator and then outputs to the third modulator through an end c of the second circulator, the first pulse generator provides a first pulse signal for the third modulator; the second fiber Bragg grating transmits a sixth optical signal to the fourth modulator, the second pulse generator provides a second pulse signal for the fourth modulator; an end a of the third circulator is connected with an output end of the fourth modulator, an end b of the third circulator is connected with one end of the third fiber Bragg grating, the other end of the third fiber Bragg grating is connected with the third modulator; the third fiber Bragg grating reflects a light signal outputted by the end b of the third circulator back to the end b of the third circulator 43, and transmits a seventh optical signal to the end b of the third circulator; an end c of the third circulator outputs an eighth optical signal;

the eighth optical signal, outputted by the end c of the third circulator, is adjusted with the polarization controller to a linear polarized light, the linear polarized light is inputted and amplified by the optical fiber amplifier, the amplified optical signal as a pump light is adjusted with the scrambler and then is inputted to the fourth circulator, an end b of the fourth circulator transmits the pump light to the sensing fibers;

when Brillouin scattering occurs in the sensing fibers with the detecting light and the pump light, the detecting light is transmitted to the fifth circulator through an end c of the fourth circulator, an end b of the fifth circulator is connected with the fourth fiber Bragg grating; the fourth fiber Bragg grating is adapted for filtering out stray light and partial spontaneous radiation spectral composition; an end c of the fifth circulator is connected with an input end of the photodetector; an output end of the photodetector is connected with an input end of the data processing module;

the data processing module sends a corresponding sign signal to both the first optical microwave frequency discriminator and the second optical microwave frequency discriminator, so as to respectively control VCO (Voltage Controlled Oscillator) to scan; through analyzing the changes of the system signal frequency and amplitude in the time domain, the temperature and strain data are obtained;

According to the law of conservation of energy, the frequency of sound waves is equal to the Brillouin frequency shift size, wherein the Brillouin frequency shift Vs is represented by a formula of $$v_B = \frac{2nV}{\lambda}\sin(\theta/2), \quad (1\text{-}1)$$

here, $\lambda$ is a pump light wavelength, n is a refractive index in the fibers, $\theta$ is an angle between the pump light and the Stokes light.

The Brillouin frequency shift of the back Brillouin in the fibers is related to the sound velocity in the fibers, wherein the sound velocity V in the fibers is represented by a formula of $$V = \sqrt{\frac{(1-k)E}{(1+k)(1-2k)\rho}}, \quad (1\text{-}2)$$

here, E is a Young's modulus of medium, K is a Poisson's ratio and $\rho$ is a medium density.

Therefore, the change of temperature and strain in the external environment will affect the sound field in the fibers, which further affects the light velocity in the fibers, so as to change the power and the frequency shift of the Brillouin scattering signal.

Taking into account the effects of thermo-optic effect and elasto-optical effect on the fiber density, Young's modulus and Poisson's ratio, through the formulas (1-1) and (1-2), it can be obtained that the relationship between the fiber Brillouin frequency shift and both temperature and strain is represented by a formula of $$v_B = \frac{2n(T,\varepsilon)}{\lambda}\sqrt{\frac{[1-k(T,\varepsilon)]E(T,\varepsilon)}{[1+k(T,\varepsilon)][1-2k(T,\varepsilon)]\rho(T,\varepsilon)}}. \quad (1\text{-}3)$$

Advantages of the present invention are as follows.

(1) The present invention adopts new optical microwave frequency discriminators to accurately control and change the frequency differences $f_{+2}\text{-}f_{+1}$ and $f_{+1}\text{-}f_0$, so as to significantly improve the measurement accuracy of temperature and stress.

(2) The space monitoring distance of the present invention is long and up to 100 kM, which can meet the needs of long-distance monitoring.

(3) In the present invention, the application of multi-spectral channel technology ensures the long-range temperature and stress monitoring accuracy.

DETAILED DESCRIPTION OF THE PREFERRED EMBODIMENT

Figure 1:
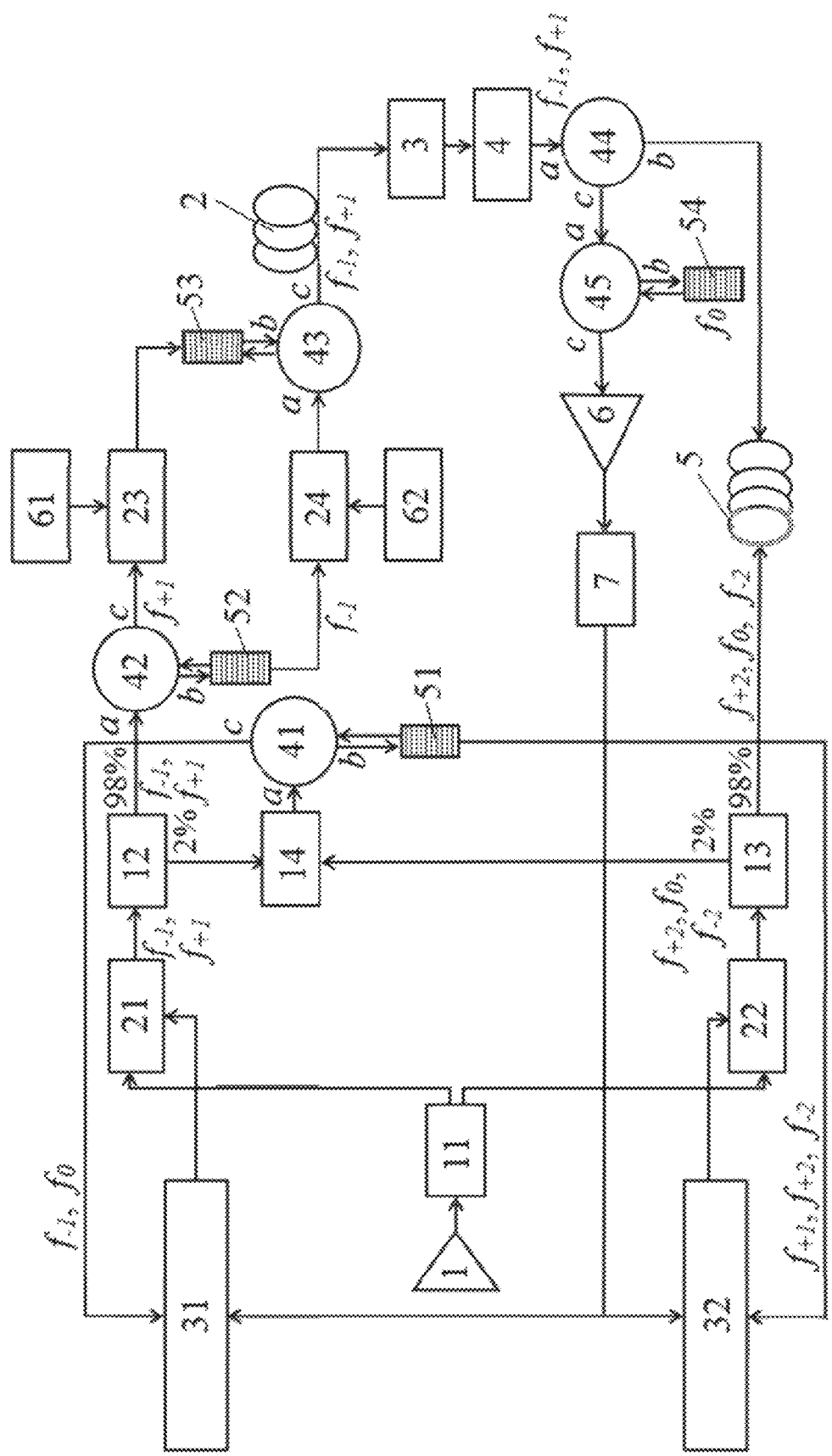
FIG. 1 is a structural diagram of a Brillouin sensing system provided by the present invention.

The present invention is further explained with accompanying drawings, but not intended to limit the scope of the present invention.

The present invention provides a Brillouin sensing system using optical microwave frequency discriminators and a scrambler, which comprises a DFB (Distributed Feedback) laser 1, a polarization controller 2, an optical fiber amplifier 3, a scrambler 4, sensing fibers 5, a photodetector 6, a data processing module 7, a first coupler 11, a second coupler 12, a third coupler 13, a fourth coupler 14, a first modulator 21, a second modulator 22, a third modulator 23, a fourth modulator 24, a first optical microwave frequency discriminator 31, a second optical microwave frequency discriminator 32, a first circulator 41, a second circulator 42, a third circulator 43, a fourth circulator 44, a fifth circulator 45, a first fiber Bragg grating 51, a second fiber Bragg grating 52, a third fiber Bragg grating 53, a fourth fiber Bragg grating 54, a first pulse generator 61, and a second pulse generator 62.

As shown in FIG. 1, a light beam outputted by the DFB laser 1 is divided into two paths of laser signals with a frequency of $f_0$ through the first coupler 11.

A path of laser signal with the frequency of $f_0$ is inputted into the first modulator 21, and then the first modulator 21 outputs a first optical signal containing two frequencies of $f_{+1}$ and $f_{-1}$ to the second coupler 12, the second coupler 12 outputs 2% of the first optical signal to the fourth coupler 14; another path of laser signal with the frequency of $f_0$ is inputted into the second modulator 22, the second modulator 22 outputs a second optical signal containing three frequencies of $f_{+2}$, $f_0$ and $f_{-2}$ to the third coupler 13, the third coupler 13 outputs 2% of the second optical signal to the fourth coupler 14.

The fourth coupler 14 receives and mixes 2% of the first optical signal outputted by the second coupler 12, with 2% of the second optical signal outputted by the third coupler 13; the mixed optical signal has five frequencies, namely, $f_{+1}$, $f_{-1}$, $f_0$, $f_{+2}$ and $f_{-2}$; an output end of the fourth coupler 14 is connected with an end a of the first circulator 41, an end b of the first circulator 41 is connected with the first fiber Bragg grating 51, the first fiber Bragg grating 51 reflects a third optical signal containing the two frequencies of $f_{-1}$ and $f_0$ to the first optical microwave frequency discriminator 31 through an end c of the first circulator 41, the first optical microwave frequency discriminator 31 provides a first modulated signal for the first modulator 21; the first fiber Bragg grating 51 transmits a fourth optical signal containing the three frequencies of $f_{+1}$, $f+_2$ and $f_{-2}$ to the second optical microwave frequency discriminator 32, the second optical microwave frequency discriminator 32 provides a second modulated signal for the second modulator 22.

The third coupler 13 receives the second optical signal containing the three frequencies of $f_{+2}$, $f_0$ and $f_{-2}$ outputted by the second modulator 22 and then outputs 98% of the second optical signal as a detecting light to the sensing fibers 5.

The second coupler 12 receives the first optical signal containing the two frequencies of $f_{+1}$ and $f_{-1}$ outputted by the first modulator 21 and then outputs 98% of the first optical signal to an end a of the second circulator 42; an end b of the second circulator 42 is connected with the fourth modulator 24 through the second fiber Bragg grating 52; the second Bragg grating 52 reflects a fifth optical signal containing the frequency of $f_{+1}$ back to the second circulator 42 and then outputs to the third modulator 23 through an end c of the second circulator 42, the first pulse generator 61 provides a first pulse signal for the third modulator 23; the second fiber Bragg grating 52 transmits a sixth optical signal containing the frequency of $f_{-1}$ to the fourth modulator 24, the second pulse generator 62 provides a second pulse signal for the fourth modulator 24; an end a of the third circulator 43 is connected with an output end of the fourth modulator 24, an end b of the third circulator 43 is connected with one end of the third fiber Bragg grating 53, the other end of the third fiber Bragg grating 53 is connected with the third modulator 23; the third fiber Bragg grating 53 reflects a light signal outputted by the end b of the third circulator 43 back to the end b of the third circulator 43, and transmits a seventh optical signal containing the frequency of $f_{+1}$ to the end b of the third circulator 43; an end c of the third circulator 43 outputs an eighth optical signal containing the two frequencies of $f_{+1}$ and $f_{-1}$.

The eighth optical signal, outputted by the end c of the third circulator 43, is adjusted with the polarization controller 2 to a linear polarized light, the linear polarized light is inputted and amplified by the optical fiber amplifier 3, the amplified optical signal as the pump light is adjusted with the scrambler 4 and then is inputted to the fourth circulator 44, an end b of the fourth circulator 44 transmits the pump light to the sensing fibers 5.

When Brillouin scattering occurs in the sensing fibers 5 with the detecting light and the pump light, the detecting light is transmitted to the fifth circulator 45 through an end c of the fourth circulator 44, an end b of the fifth circulator 45 is connected with the fourth fiber Bragg grating 54; the fourth fiber Bragg grating 54 is adapted for filtering out stray light and partial spontaneous radiation spectral composition; an end c of the fifth circulator 45 is connected with an input end of the photodetector 6; an output end of the photodetector 6 is connected with an input end of the data processing module 7.

The data processing module 7 sends a corresponding sign signal to both the first optical microwave frequency discriminator 31 and the second optical microwave frequency discriminator 32, so as to respectively control VCO (Voltage Controlled Oscillator) to scan; through analyzing the changes of the system signal frequency and amplitude in the time domain, the temperature and strain data are obtained.

According to the law of conservation of energy, the frequency of sound waves is equal to the Brillouin frequency shift size, wherein the Brillouin frequency shift Vs is represented by a formula of $$v_B = \frac{2nV}{\lambda}\sin(\theta/2), \qquad (1\text{-}1)$$

here, $\lambda$ is a pump light wavelength, n is a refractive index in the fibers, $\theta$ is an angle between the pump light and the Stokes light.

The Brillouin frequency shift of the back Brillouin in the fibers is related to the sound velocity in the fibers, wherein the sound velocity V in the fibers is represented by a formula of $$V = \sqrt{\frac{(1-k)E}{(1+k)(1-2k)\rho}}, \qquad (1\text{-}2)$$

here, E is a Young's modulus of medium, K is a Poisson's ratio and $\rho$ is a medium density.

Therefore, the change of temperature and strain in the external environment will affect the sound field in the fibers, which further affects the light velocity in the fibers, so as to change the power and the frequency shift of the Brillouin scattering signal.

Taking into account the effects of thermo-optic effect and elasto-optical effect on the fiber density, Young's modulus and Poisson's ratio, through the formulas (1-1) and (1-2), it can be obtained that the relationship between the fiber Brillouin frequency shift and both temperature and strain is represented by a formula of $$v_B = \frac{2n(T,\varepsilon)}{\lambda}\sqrt{\frac{[1-k(T,\varepsilon)]E(T,\varepsilon)}{[1+k(T,\varepsilon)][1-2k(T,\varepsilon)]\rho(T,\varepsilon)}}. \qquad (1\text{-}3)$$

Both of the first and second optical microwave frequency discriminators 31 and 32 are configured to receive two paths of optical signals with the frequency difference, convert the two paths of optical signals into microwave signals with the corresponding phase difference, convert the envelope signals coupled by the microwave signals into the control signals of the VCO, so as to adjust the output frequency of the VCO to adjust the frequency components of the optical signal, for finally achieving the high-precision frequency control and frequency scanning function. Moreover, the first optical microwave frequency discriminator 31 and the second optical microwave frequency discriminator 32 are same in structure.

Figure 2:
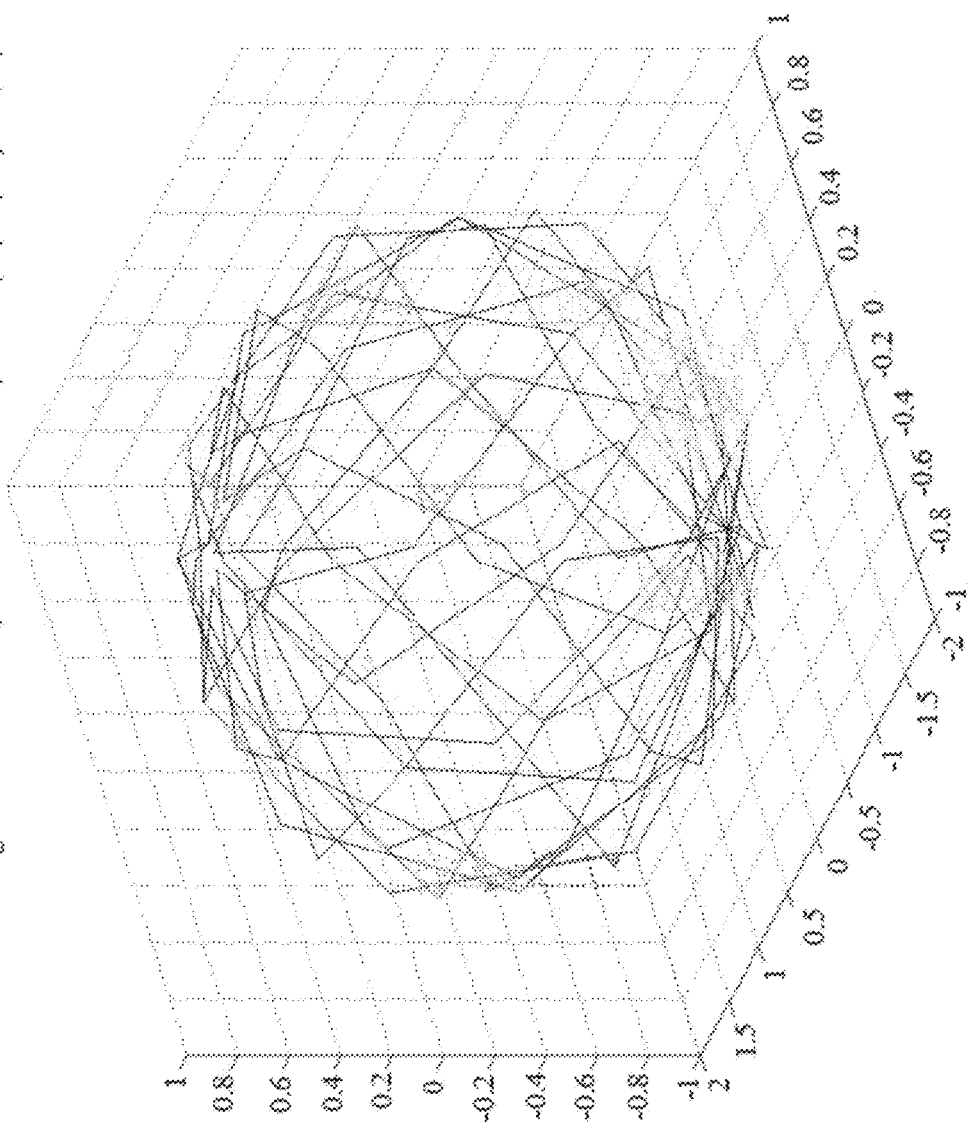
FIG. 2 is a polarization distribution diagram of the Brillouin sensing system which is scrambled by a scrambler.

FIG. 2 is a polarization distribution diagram of the Brillouin sensing system which is scrambled by the scrambler 4. The scrambler 4 achieves polarization average by forward/backward swing of the wave plate, which is able to reduce the noise and improve the anti-interference ability of the system, thereby improving the signal to noise ratio of the entire system.

What is claimed is:

1. A Brillouin sensing system using optical microwave frequency discriminators and a scrambler, comprising: a DFB (Distributed Feedback) laser, a polarization controller, an optical fiber amplifier, a scrambler, sensing fibers, a photodetector, a data processing module, a first coupler, a second coupler, a third coupler, a fourth coupler, a first modulator, a second modulator, a third modulator, a fourth modulator, a first optical microwave frequency discriminator, a second optical microwave frequency discriminator, a first circulator, a second circulator, a third circulator, a fourth circulator, a fifth circulator, a first fiber Bragg grating, a second fiber Bragg grating, a third fiber Bragg grating, a fourth fiber Bragg grating, a first pulse generator, and a second pulse generator, wherein:

a light beam outputted by the DFB laser is divided into two paths of laser signals with a frequency of $f_0$ through the first coupler;

a path of laser signal with the frequency of $f_0$ is inputted into the first modulator, and then the first modulator outputs a first optical signal containing two frequencies of $f_{+1}$ and $f_{-1}$ to the second coupler, the second coupler outputs 2% of the first optical signal to the fourth coupler; another path of laser signal with the frequency of $f_0$ is inputted into the second modulator, the second modulator outputs a second optical signal containing three frequencies of $f_{+2}$, $f_0$ and $f_{-2}$ to the third coupler, the third coupler outputs 2% of the second optical signal to the fourth coupler;

the fourth coupler receives and mixes 2% of the first optical signal outputted by the second coupler, with 2% of the second optical signal outputted by the third coupler; the mixed optical signal has five frequencies, $f_{+1}$, $f_{-1}$, $f_0$, $f_{+2}$ and $f_{-2}$; an output end of the fourth coupler is connected with an end a of the first circulator, an end b of the first circulator is connected with the first fiber Bragg grating, the first fiber Bragg grating reflects a third optical signal containing the two frequencies of $f_{-1}$ and $f_0$ to the first optical microwave frequency discriminator through an end c of the first circulator, the first optical microwave frequency discriminator provides a first modulated signal for the first modulator; the first fiber Bragg grating transmits a fourth optical signal containing the three frequencies of $f_{+1}$, $f_{+2}$ and $f_{-2}$ to the second optical microwave frequency discriminator, the second optical microwave frequency discriminator provides a second modulated signal for the second modulator;

the third coupler receives the second optical signal containing the three frequencies of $f_{+2}$, $f_0$ and $f_{-2}$ outputted by the second modulator and then outputs 98% of the second optical signal as a detecting light to the sensing fibers;

the second coupler receives the first optical signal containing the two frequencies of $f_{+1}$ and $f_{-1}$ outputted by the first modulator and then outputs 98% of the first optical signal to an end a of the second circulator; an end b of the second circulator is connected with the fourth modulator through the second fiber Bragg grating; the second Bragg grating reflects a fifth optical signal containing the frequency of $f_{+1}$ back to the second circulator and then outputs to the third modulator through an end c of the second circulator, the first pulse generator provides a first pulse signal for the third modulator; the second fiber Bragg grating transmits a sixth optical signal containing the frequency of $f_{-1}$ to the fourth modulator, the second pulse generator provides a second pulse signal for the fourth modulator; an end a of the third circulator is connected with an output end of the fourth modulator, an end b of the third circulator is connected with one end of the third fiber Bragg grating, the other end of the third fiber Bragg grating is connected with the third modulator; the third fiber Bragg grating reflects a light signal outputted by the end b of the third circulator back to the end b of the third circulator, and transmits a seventh optical signal containing the frequency of $f_{+1}$ to the end b of the third circulator; an end c of the third circulator outputs an eighth optical signal containing the two frequencies of $f_{+1}$ and $f_{-1}$;

the eighth optical signal, outputted by the end c of the third circulator, is adjusted with the polarization controller to a linear polarized light, the linear polarized light is inputted and amplified by the optical fiber amplifier, the amplified optical signal as the pump light is adjusted with the scrambler and then is inputted to the fourth circulator, an end b of the fourth circulator transmits the pump light to the sensing fibers;

when Brillouin scattering occurs in the sensing fibers with the detecting light and the pump light, the detecting light is transmitted to the fifth circulator through an end c of the fourth circulator, an end b of the fifth circulator is connected with the fourth fiber Bragg grating; the fourth fiber Bragg grating is adapted for filtering out stray light and partial spontaneous radiation spectral composition; an end c of the fifth circulator is connected with an input end of the photodetector; an output end of the photodetector is connected with an input end of the data processing module;

the data processing module sends a corresponding sign signal to both the first optical microwave frequency discriminator and the second optical microwave frequency discriminator, so as to respectively control VCO (Voltage Controlled Oscillator) to scan;

through analyzing the changes of the system signal frequency and amplitude in the time domain, the temperature and strain data are obtained.

2. The Brillouin sensing system, as recited in claim 1, wherein: both of the first and second optical microwave frequency discriminators are configured to receive two paths of optical signals with the frequency difference, convert the two paths of optical signals into microwave signals with a corresponding phase difference, convert envelope signals coupled by the microwave signals into control signals of the VCO, so as to adjust an output frequency of the VCO to adjust frequency components of the optical signal, for finally achieving high-precision frequency control and frequency scanning function; the first optical microwave frequency discriminator and the second optical microwave frequency discriminator are same in structure.

* * * * *